United States Patent
Magnusdottir et al.

(10) Patent No.: US 9,966,487 B2
(45) Date of Patent: May 8, 2018

(54) STRAIN RELIEF APPARATUS FOR SOLAR MODULES

(71) Applicant: SolarCity Corporation, San Mateo, CA (US)

(72) Inventors: Lilja Magnusdottir, San Rafael, CA (US); Pablo Gonzalez, Fremont, CA (US); Peter Nguyen, San Jose, CA (US)

(73) Assignee: SolarCity Corporation, San Mateo, CA (US)

( * ) Notice: Subject to any disclaimer, the term of this patent is extended or adjusted under 35 U.S.C. 154(b) by 0 days. days.

(21) Appl. No.: 14/985,376

(22) Filed: Dec. 30, 2015

(65) Prior Publication Data
US 2017/0170349 A1    Jun. 15, 2017

Related U.S. Application Data

(60) Provisional application No. 62/267,281, filed on Dec. 14, 2015.

(51) Int. Cl.
*H01L 31/042* (2014.01)
*H01L 31/05* (2014.01)
(Continued)

(52) U.S. Cl.
CPC ........ *H01L 31/0508* (2013.01); *B23K 1/0016* (2013.01); *B23K 1/012* (2013.01);
(Continued)

(58) Field of Classification Search
CPC .. H01L 31/05–31/0508; H01L 31/0504; H01L 31/0201
(Continued)

(56) References Cited

U.S. PATENT DOCUMENTS

| 4,301,322 A | 11/1981 | Amick |
| 4,888,702 A | 12/1989 | Gerken et al. |

(Continued)

FOREIGN PATENT DOCUMENTS

| DE | 39 02 838 A1 | 8/1989 |
| DE | 43 30 282 A1 | 3/1994 |

(Continued)

OTHER PUBLICATIONS

F. Kraemer, J. Seib, E. Peter and S. Wiese, "Mechanical Stress Analysis in Photovoltaic Cells During the String-Ribbon Interconnection Process," 2014 15$^{th}$ International Conference on Thermal, Mechanical and Multi-Physics Simulation and Experiments in Microelectronics and Microsystems, (EuroSimE 2014), Apr. 7-9, 2014, Ghent, Belgium, ( Abstract only), 2 pages.

(Continued)

*Primary Examiner* — Niki Bakhtiari
(74) *Attorney, Agent, or Firm* — Kilpatrick Townsend & Stockton LLP (57) ABSTRACT

A photovoltaic module can be constructed from one or more strings, with each of the strings being constructed from a plurality of cascaded solar cells. A connector can electrically connect the strings to one another. The connector can include strain relief connectors that extend between the connector and the strings to help reduce effects caused by thermal expansion.

3 Claims, 9 Drawing Sheets

(51) Int. Cl.
*H01L 31/02* (2006.01)
*H01L 31/0475* (2014.01)
*B23K 1/00* (2006.01)
*B23K 1/012* (2006.01)
*B23K 3/08* (2006.01)
*B65G 47/90* (2006.01)
*H01L 21/66* (2006.01)
*H01L 31/18* (2006.01)

(52) U.S. Cl.
CPC ........... *B23K 3/08* (2013.01); *B65G 47/90* (2013.01); *H01L 22/12* (2013.01); *H01L 31/0201* (2013.01); *H01L 31/0475* (2014.12); *H01L 31/0504* (2013.01); *H01L 31/18* (2013.01); *Y02E 10/50* (2013.01)

(58) Field of Classification Search
USPC .................................................. 136/243–265
See application file for complete search history.

(56) References Cited

U.S. PATENT DOCUMENTS

| | | | |
|---|---|---|---|
| 5,006,179 A | 4/1991 | Gaddy | |
| 5,158,618 A | 10/1992 | Rubin | |
| 5,430,616 A | 7/1995 | Katsu et al. | |
| 6,034,322 A | 3/2000 | Pollard | |
| 6,150,602 A | 11/2000 | Campbell | |
| 7,419,377 B1 | 9/2008 | Briere et al. | |
| 7,732,705 B2 | 6/2010 | Stan et al. | |
| 8,537,554 B1 | 9/2013 | Hockaday | |
| 2005/0022857 A1* | 2/2005 | Daroczi | H01L 31/0516 136/244 |
| 2007/0144578 A1 | 6/2007 | Cunningham et al. | |
| 2008/0072951 A1 | 3/2008 | Gabor | |
| 2008/0083453 A1* | 4/2008 | Rose | H01L 31/0201 136/256 |
| 2008/0223429 A1 | 9/2008 | Everett et al. | |
| 2009/0159116 A1 | 6/2009 | Umetani et al. | |
| 2009/0277491 A1 | 11/2009 | Nakamura et al. | |
| 2010/0116323 A1 | 5/2010 | Katayama et al. | |
| 2010/0243024 A1 | 9/2010 | Hashimoto et al. | |
| 2011/0048491 A1 | 3/2011 | Taira | |
| 2011/0240337 A1 | 10/2011 | Montello et al. | |
| 2012/0073621 A1 | 3/2012 | Hashimoto | |
| 2014/0124014 A1* | 5/2014 | Morad | H01L 31/042 136/246 |

FOREIGN PATENT DOCUMENTS

| | | |
|---|---|---|
| DE | 198 48 682 A1 | 5/2000 |
| DE | 10 2006 019638 A1 | 11/2007 |
| JP | 2004-193444 A | 7/2004 |
| JP | 2005-142282 A | 6/2005 |
| WO | 2005/098969 A1 | 10/2005 |
| WO | 2013100856 A2 | 7/2013 |

OTHER PUBLICATIONS

"SunPower® Module 40-Year Useful Life," SunPower Corporation, San Jose, CA, 2013, http://www.sunpower.com, retrieved from the internet on Feb. 18, 2016 at http://us.sunpower.com/sites/sunpower/files/media-library/white-papers/wp-sunpower-module-40-year-useful-life.pdf, 14 pages.

International Search Report, dated Dec. 14, 2016, for corresponding international application PCT/2016/049688, 6 pages.

Written Opinion, dated Dec. 14, 2016, for corresponding international application PCT/2016/049688, 5 pages.

* cited by examiner

STRAIN RELIEF APPARATUS FOR SOLAR MODULES

CROSS-REFERENCE TO RELATED APPLICATION

This claims the benefit of Provisional Application No. 62/267,281, filed on Dec. 14, 2015, the entirety of which is incorporated herein by reference.

DEFINITIONS

"Solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," or "strip" is a portion or segment of a photovoltaic structure, such as a solar cell. A solar cell may be divided into a number of strips. A strip may have any shape and any size. The width and length of a strip may be the same or different from each other. Strips may be formed by further dividing a previously divided strip.

A "cascade" is a physical arrangement of solar cells or strips that are electrically coupled via electrodes on or near their edges. There are many ways to physically connect adjacent photovoltaic structures. One way is to physically overlap them at or near the edges (e.g., one edge on the positive side and another edge on the negative side) of adjacent structures. This overlapping process is sometimes referred to as "shingling." Two or more cascading photovoltaic structures or strips can be referred to as a "cascaded string," or more simply as a string.

"Finger lines," "finger electrodes," and "fingers" refer to elongated, electrically conductive (e.g., metallic) electrodes of a photovoltaic structure for collecting carriers.

A "busbar," "bus line," or "bus electrode" refers to an elongated, electrically conductive (e.g., metallic) electrode of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or solar cell strip. A photovoltaic structure is not limited to a device fabricated by a particular method. For example, a photovoltaic structure can be a crystalline silicon-based solar cell, a thin film solar cell, an amorphous silicon-based solar cell, a poly-crystalline silicon-based solar cell, or a strip thereof.

BACKGROUND

Photovoltaic (PV) technology has made great strides in recent years through breakthroughs in efficiency for PV modules. Such improvements, in combination with decreases in manufacturing cost for PV modules is making solar a more viable energy source. Cost per watt is perhaps the most determinative factor when deciding to implement a solar power installation.

Solar cells can be constructed from a base structure of silicon and assembled into a PV module having a basic laminate structure. To reduce costs and for other advantages, recent improvement in using connection materials such as copper, to form a connection grid for a solar cell have improved efficiency and lowered overall cost per watt, thus improving the viability of solar energy.

However, use of materials such as copper can present issues due to disparate coefficients of expansion that exist with respect to silicon based solar cells. Generally, copper expands much more than silicon for a given increase in temperature. Detrimental effects due to expansion can be exacerbated when portions of a PV module are shaded, thus increasing the temperature differential between portions of the PV module. Over time, cyclical thermal loading can cause portions of the PV module to break. Accordingly, there is a need to overcome such issues, but without reverting to exotic and expensive connection materials.

BRIEF SUMMARY

As noted above, use of materials such as copper within a PV module can cause problems due to disparate coefficients of expansion with respect to silicon. This is particularly true of connectors that have large mass, which is required for transmission of current, but as a result can have a large thermal expansion effect for the PV module as a whole. Such connectors are used to connect strings in series and/or parallel depending on the electrical configuration of a particular PV module. Often, the result of thermal expansion of these connectors is fracturing of epoxied connections between overlapping strips that make up a string. To overcome these issues, relatively low mass strain relief connectors can be used to connect to large mass connector portions.

Such strain relief connectors can have non-linear/curvilinear geometry for connection between two points. The geometry can include one or more non-linear shapes, such as curves, such that thermal expansion and contraction of the connectors has a limited effect on the strings. Put another way, strain that would be otherwise subjected to string connections are mitigated by the flexibility of the strain relief elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the invention is not limited to the embodiments shown, but is to be accorded the widest scope consistent with the principles and features disclosed herein.

Figure 1A:
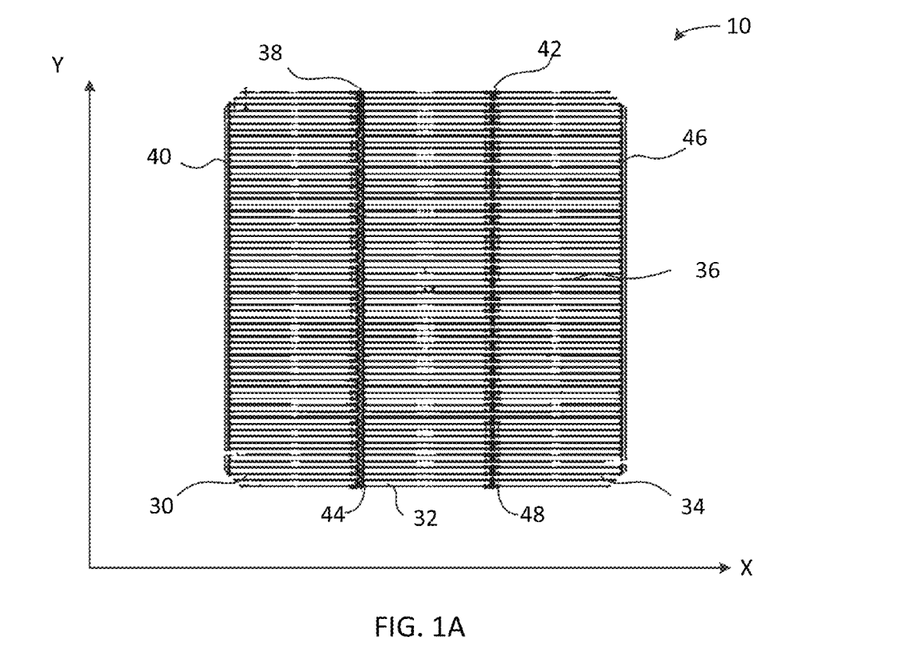
FIG. 1A shows a top view of a solar cell, according to some embodiments of the invention.

FIG. 1A shows exemplary solar cell 10, which can include three photovoltaic strips 30, 32, and 34, and which can have electrodes formed from electroplated copper. Because electroplated copper electrodes exhibit low contact resistance, solar cell 10 can be divided into fewer strips than many other materials. Each of photovoltaic strips 30, 32, and 34, can include a number of (e.g., substantially parallel) finger lines, such as finger lines 36, arranged in the X direction, or any other direction. These finger lines can collect the electric charges generated by the photovoltaic structure and allow them to move toward a busbar. The busbar can be any electrically conductive element such as a metallic strip, often wider than a finger line, arranged in the Y direction. The busbar then can aggregate the current collected by the finger lines. Each strip can include two busbars, one on each surface, positioned on opposite edges. For example, strip 30 can have busbar 38 on the top surface, and busbar 34 on the bottom surface. Similarly, strip 32 can have busbars 42 and 44 on the top and bottom surfaces, respectively, and strip 34 can have busbars 46 and 48 on the top and bottom surfaces, respectively.

Some conventional solar panels include a single string of serially connected un-cleaved photovoltaic structures. As described in U.S. patent application Ser. No. 14/563,867, which is hereby incorporated by reference herein, it can be more desirable to have multiple (such as 3) strings, each string including cascaded strips, and connect these strings in parallel. Such a multiple-parallel-string panel configuration provides the same output voltage with a reduced internal resistance.

Figure 1B:
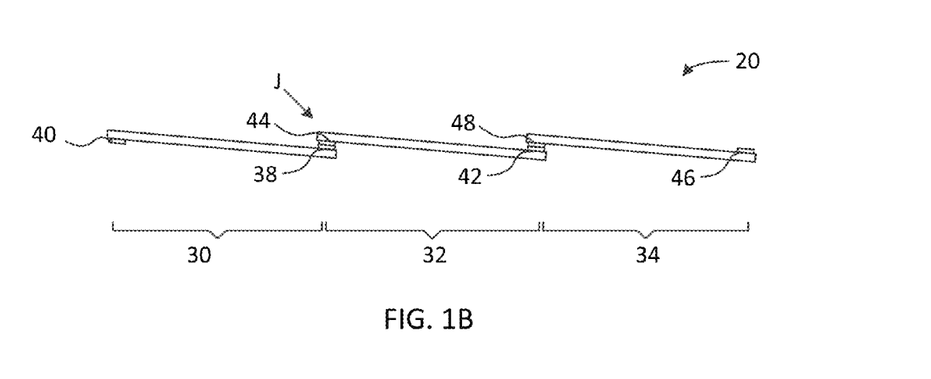
FIG. 1B shows a side view of a string constructed from strips, according to some embodiments of the invention.

FIG. 1B shows an exemplary cascaded arrangement of three strips connected in series and assembled as string 20. In this example, three strips 30, 32, and 33 can be cleaved from solar cell 10 of FIG. 1A and arranged in a cascaded manner, such that the positive-side busbar of one strip overlaps and is electrically coupled to the negative-side busbar of the neighboring strip. While three strips are depicted for string 20, more or less strips can make up a string. In addition, string 20 can be coupled with additional strings (eleven of strings 20 for example) to produce a longer string, and six of these longer strings can be connected to form a PV module.

Often, assembly of a string is performed by adhering each busbar using a conductive adhesive, which is an effective method to assemble an efficient PV modules. However, in some environments, PV modules exhibit great strain due to effects of heating, and in particular, effects of heating components, such as copper busbars, that have a disparate coefficient of expansion as compared to other components. This can be exacerbated by non-uniform heating of the PV modules, often caused by partial sun shading of the PV modules. These heating effects can result in cyclical loading onto joints J between busbars, resulting in cracking and eventual failure of the joint. Connectors as disclosed herein can help alleviate these effects.

Figure 2:
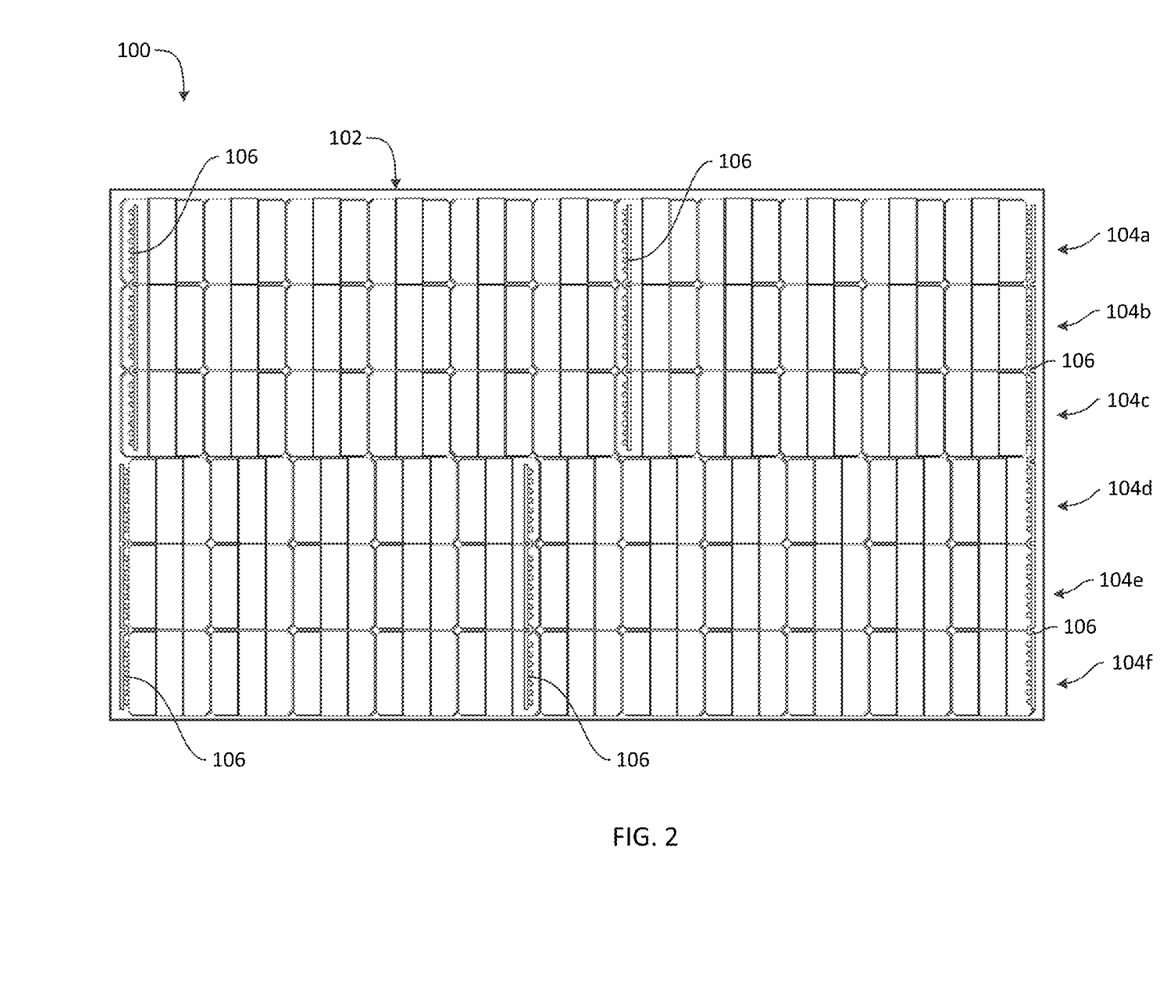
FIG. 2 shows a top view of a PV module, according to some embodiments of the invention.

FIG. 2 shows a top view of PV module 100. PV module 100 can have a laminated structure that includes one or more substrates 102, such as a glass sheet and/or back sheet, and one or more layers of encapsulate. PV module can include strings 104a-f, each of which can be assembled from 11 of strings 20 of FIG. 1B, for example.

Connection members 106 can be connected to bussed portions of strings 104a-f by way of strain relief connectors, which are described in further detail below. Connection to the bussed portions of strings 104a-f, can be made by any suitable electrical connection, such as by soldering, welding, or bonding strain relief connectors 106 to busbars of strings 104. Connection members 106 can be formed primarily from copper, for example, while strings 104a-f can be primarily formed from overlapping bonded solar cells primarily formed from silicon. Copper has a linear expansion coefficient that is approximately 5.4 times greater than the linear expansion coefficient of silicon. Thus, when all or portion of PV module 100 are heated or cooled, connection members 106 will tend to elongate or contract to a greater degree than strings 104a-f. This movement can initiate shear forces at bonded joints between the solar cells of strings 104a-f. Strain relief connectors located between the connection members 106 and strings 104a-f can help alleviate destructive thermal expansion and contraction effects in PV module 100.

Figures 3A, 3B:
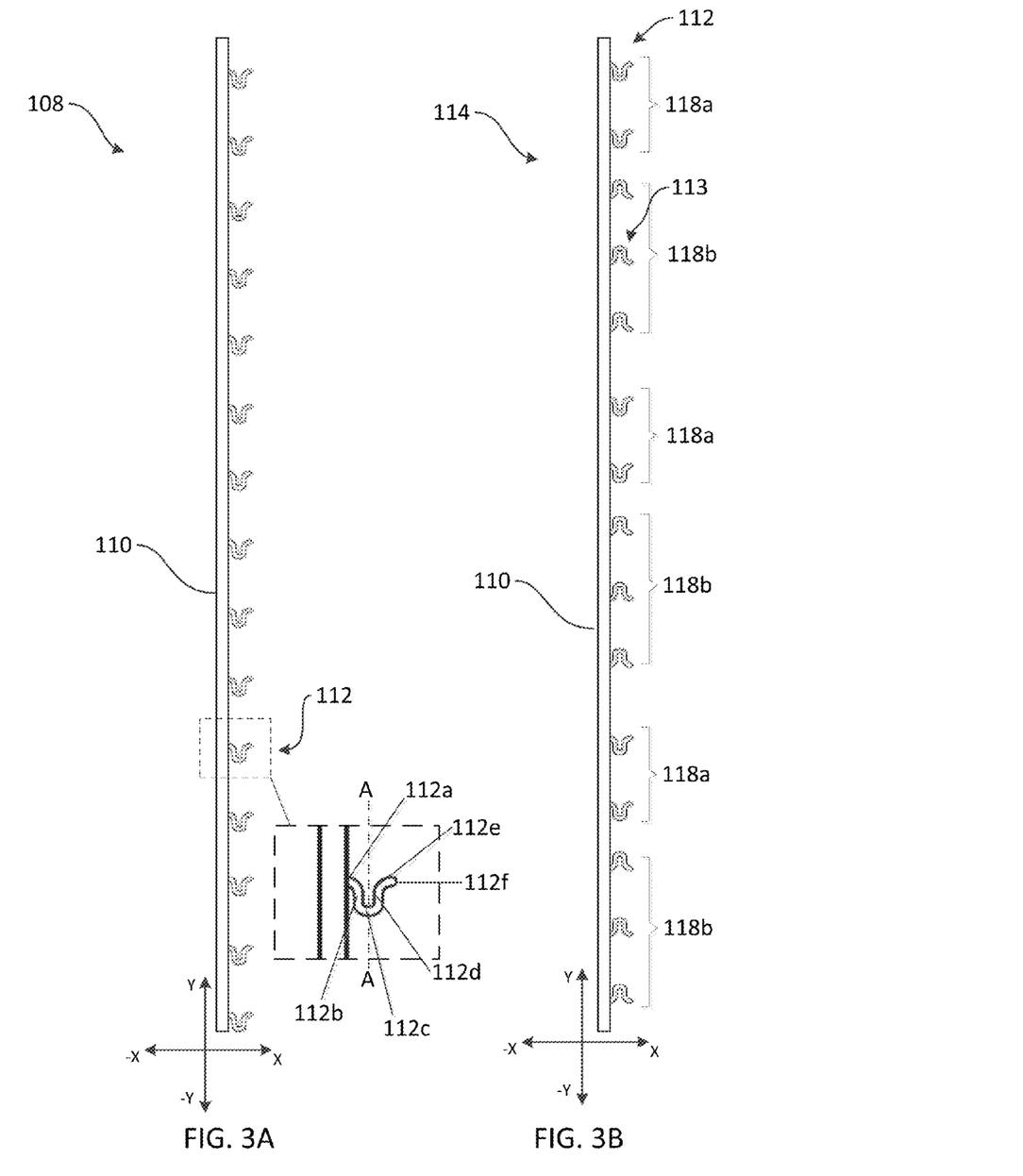
FIGS. 3A-3F show top views of connection members, according to some embodiments of the invention.

FIG. 3A shows a top view of connection member 108, which can be used with PV module 100 of FIG. 2 for example. Any of the connection members disclosed herein can be stamped, cut, or otherwise formed from conductive material, such as copper. Copper is a highly conductive and relatively low cost connector material. However, other conductive materials such as silver, gold, or aluminum can be used. In particular, silver or gold can be used as a coating material to prevent oxidation for copper or aluminum. In some embodiments, alloys that have been heat treated to have super-elastic properties can be used for all or part of the connection members. Suitable alloys may include, for example, copper-zinc-aluminum (CuZnAl), copper-aluminum-nickel (CuAlNi), or copper-aluminum-beryllium (CuAlBe).

In addition, the material of the connection members disclosed herein can be manipulated in whole or in part to alter mechanical properties. For example, all or part of connection member 108 can be forged (e.g., to increase strength), (e.g., annealed to increase ductility), and/or tempered (e.g. to increase surface hardness). Connection members can be coated at portions with insulation to prevent shorting. Connection members can also be coated at portions with solder material for reflow soldering to other conductors.

Connection member 108 can include connection bus 110, which is elongated for connection to one or more strings. Here, connection member 108 is configured to connect three strings in parallel. The smallest cross-sectional area of connection bus 110 can be dimensioned to be sufficient enough to carry a predicted current load.

Strain relief connectors 112 can extend laterally from connection bus 110. Strain relief connectors 112 and connection bus 110 can be formed from a single piece of material, for example, by die cutting or laser cutting a foil sheet. However, in some cases, one or more of strain relief connectors 112 can be attached to connection bus 110 by any suitable electrical connection, such as a connection formed by soldering, welding, or bonding. Generally, the total cross-sectional area of strain relief connectors 112 for one string combined should be at least equal to the cross-sectional area of connection bus 110. However, in some cases the total cross-sectional area of strain relief connectors 112 can be significantly greater for durability. For example, strain relief connectors 112 can have three times the about of cross-sectional area of connection bus 110, with the anticipation that in the worst case, two-thirds of the strain relief connectors 112 will fail due to cyclical loading over a time period of 20 years. Accordingly, even after such failures, any remaining strain relief connectors 112 would be sufficient to provide the current capacity needed.

Each of strain relief connectors 112 extends from connection bus 110 in a non-linear manner (i.e., having non-linear geometry) along the X and Y directions. Non-linear geometry as used herein, describes a shape of all or a portion of an electrical connector formed to preferentially deform when loaded. In contrast, a connector with linear geometry generally follows the shortest/straightest path possible for the primary purpose of efficiently transmitting electrical current. Any deviations in linear geometry are typically made to route around obstacles such as circuitry, however, any such incidental path changes of a connector with linear geometry do not necessarily provide strain relief, and should not be confused for connectors with non-linear geometry as disclosed herein. Put another way, strain relief connectors having non-linear geometry could otherwise utilize more linear geometry (e.g., extend along the straightest path possible), but specifically do not do so. For example, strain relief connections may not specifically use linear geometry in order to absorb movement that would otherwise be transmitted to more fragile portions of a PV module, such as joints between solar cells, and particularly in order to absorb movement in a cyclical manner for an extended time period (e.g. decades) that spans the life of a PV module. Connection bus 110 of FIG. 3A alone, for example, has linear geometry with uniform width in the X and Y directions, and uniform thickness in the Z direction as well, however, different connection buses disclosed below do have non-linear geometry, and any of the examples of non-linear geometry disclosed herein can be applied to any of the connection buses disclosed herein.

Non-linear geometry can include paths that centrally follow a connector (e.g., a path that extends along a series centermost points located between outermost edges) or along any face or edge of the connector. A connector having non-linear geometry can have, but does not require, symmetry along the path of elongation. For example, one edge, or portion of an edge, of a connector can be straight and an opposite edge can include one or more curves, cuts, or extensions. Connectors having non-linear geometry can include straight portions before, after, and/or between non-linear portions. Non-linear geometry can include propagating paths that extend laterally along a first axis (e.g., X axis) while alternating direction in negative and positive directions of one or more other axes (e.g. Y axis and/or Z axis) that are perpendicular to the first axis, in a repetitive manner, such as a sine wave or helix for example. While many connectors disclosed herein utilize curved profiles, non-linear geometry can be constructed from a series of straight lines, for example, propagating shapes, such as square or sawtooth waves can form non-linear geometry.

Due to the laminate design of associated PV modules, many of the strain relief connecters disclosed herein using non-linear geometry are planer (e.g., varying in only in the X and Y dimensions, while having uniform thickness in the Z direction) in order to be co-planer with strings of an associated PV module. However, non-linear geometry can extend to any plane or edge in three dimensions as well. For example, a connector with non-linear geometry can include portions that fold (e.g., accordion), overlap, or coil, to provide strain relief.

Non-linear geometry can be formed before or after attachment of a linear connector. For example, a linear connector can be manipulated (e.g. punctured, bent, crimped, dimpled, twisted, and/or folded) in some manner to result with the connector having non-linear geometry. Put another way, one or more straight aspects of the linear connector can be manipulated to be non-straight. This manipulation can, for example, result in a connector having a bowed, rippled, accordion-like, or wavy appearance from a certain view, whereas before the manipulation, the same view may have showed a line or rectangular shape. In one example, non-linear geometry can be post-formed from an attached linear connector, which extends from a connection bus to a soldered joint (e.g. at a string bus) and has a pre-manipulation shape of a line in a first orthogonal view (e.g. Y axis view of a X-Z plane) showing a side of the connector, a line in a second orthogonal view (e.g. X axis view of a Y-Z plane) showing an end of the connector, and a rectangle in a third orthogonal view (e.g. Z axis view of a X-Y plane) showing a top view of the connector. Forcefully moving the connection bus closer to the soldered joint can cause the linear connector to deform, resulting in non-linear geometry of the previously linear connector. The manipulated connector can, for example, have a post-manipulation shape with a bowed profile, i.e., having a curve in the first orthogonal view that shows the side of the connector, a rectangle in the second orthogonal view that shows the end of the connector bending out of the X-Y plane, and a shortened rectangle in the third orthogonal view that shows the top of the connector.

In another example, a connector with non-linear geometry can include variations in thickness (Z direction) to help provide strain relief. Strain relief connecters disclosed herein can also include layers of material sharing different or identical non-linear geometry. Each layer of such layered strain relief connecters, can share common start and ending locations between a connection bus and string, or utilize different start and/or end locations. Non-linear geometry can also utilize passages, such as square, triangular, oval, or circular openings, that can be located between straight or varying edges. Such connectors, for example, can have a latticed or bird-cage style arrangement of such passages.

In the example shown at FIG. 3A, each of strain relief connectors 112 can have non-linear or more specifically "curvilinear" (i.e., include one or more curves) geometry that can extend laterally in a manner roughly resembling a sine wave. "Curves" as used herein, can include any physical edge or plane surface, or path defining one or more edges, of a connector between two junctions that is not straight. Initiation or termination of curve can be at junctions to straight portions of a connector, or junctions with other curves where direction of the curve changes. A "curve portion" can be any portion of a curve. A "U-shaped" curve can be a symmetric curve or curve portion having a parabolic shape that includes an identifiable axis of symmetry, but does not necessarily resemble a complete letter "U."

Here, each of strain relief connectors 112, while laterally extending in the positive X direction, can curve from connection bus 110 at point 112a towards the negative Y direction to straight portion 112b, which initiates a U-shaped curve 112c that changes direction at axis of symmetry A-A towards the positive Y direction to straight portion 112d, which initiates curve 112e in the positive X and Y directions. In some embodiments, each of strain relief connectors 112 can also curve at any point towards the negative X direction. Termination can occur at point 112f, which is where each of strain relief connectors 112 can connect to a busbar of a string. However, a solder connection can be made at any point along each of strain relief connectors 112.

The asymmetric nature of strain relief connectors 112, having one of U-shaped curve 112c, can result in different reactions with respect to forces applied at point 112f. Force applied towards the positive Y direction or negative X direction at point 112f will tend to close or pinch U-shaped curve 112c, while force applied towards the negative Y direction or positive X direction at point 112f will tend to open U-shaped curve 112c. The counter reaction of U-shaped curve 112c may be more resilient in one situation versus the other. Thus, the orientation of strain relief connectors 112 can be helpful when requiring different levels of directional resiliency.

The pattern and number of curves for each of strain relief connectors 112 can be variable. Fifteen of strain relief connectors 112 are shown here, with five of strain relief connectors 112 assigned per string. However, more or less of strain relief connectors 112 can be used.

Strain relief connectors 112 can also be configured to absorb movement of the connection bus 110, such that motion transferred to connected strings is lessened. In comparison to one of strain relief connectors 112, connection bus 110 has relatively large mass for purposes of current capacity. This mass can be detrimental however, when connection bus 110 flexes due to thermal expansion and contraction. Strings can be interconnected by epoxy joints that do not have enough capacity to tolerate strain caused by connection bus movement. Strain relief connectors 112 can absorb strain caused by connection bus movement, and thus provide strain relief for the string joints.

In the example shown at FIG. 3A, each of strain relief connectors 112 can be identically formed and arranged, however, this is not required. For example, as illustrated at FIG. 3B, connection member 114 can be arranged according to groups 118a and 118b. Group 118a can have the strain relief connectors 112 arranged as shown at FIG. 3A, but strain relief connectors 113 of group 118b can be arranged on connection bus 110 as mirror images, with respect to the X direction, of strain relief connectors 112 of group 118a. Accordingly, the different levels of directional resiliency can be changed or "tuned" by use of groups 118a and 118b. Each of group 118a includes two of connection member 112, while each group 118b include three of connection member 113, accordingly, resiliency can be biased with respect to group 118b along the Y direction, however, groups 118a can include a greater or equal amount of connection members 112 as compared to groups 118b to change this bias.

Figures 3C, 3D:
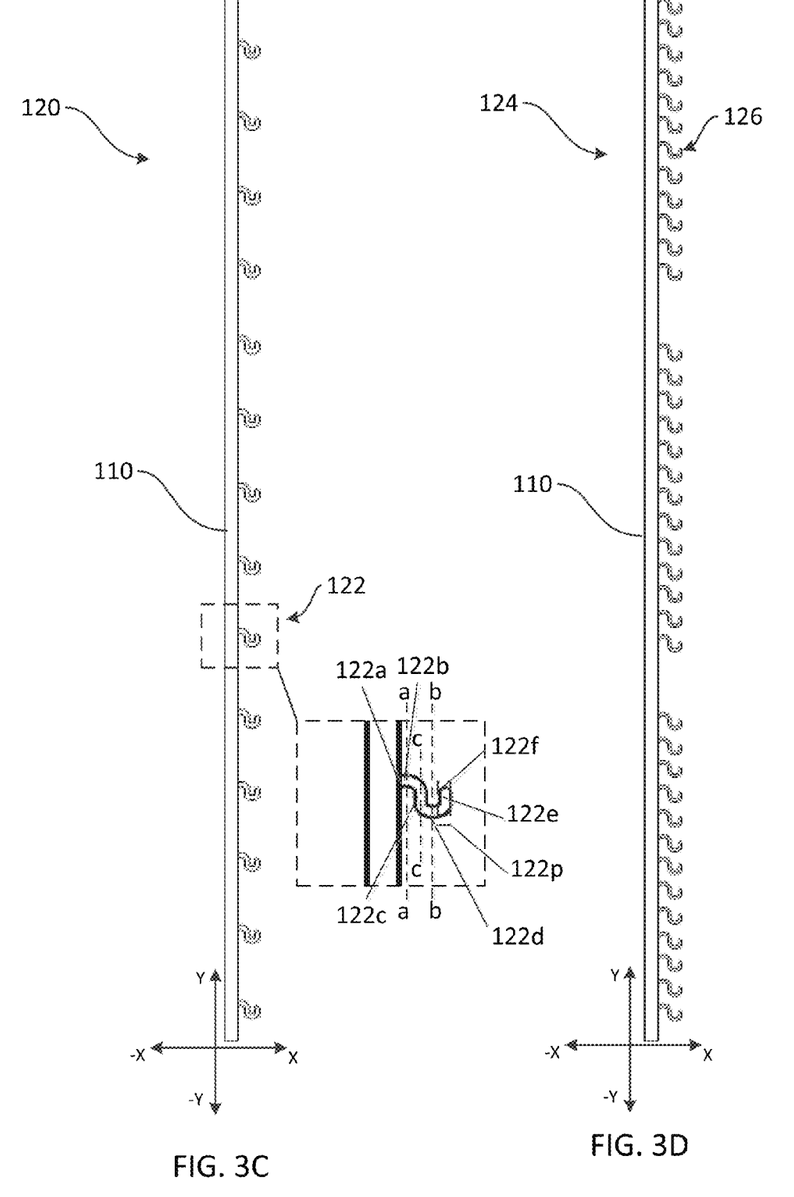

FIG. 3C shows a top view of connection member 120, which can be used with PV module 100 of FIG. 2 for example. Connection member 120 can include connection bus 110, as described with respect to FIG. 3A, and can include any of the aspects discussed with reference to the connection members disclosed herein. Here, connection member 120 can be configured to connect three strings in parallel.

Strain relief connectors 122 can extend laterally from connection bus 110. Each of strain relief connectors 122 can extend with non-linear geometry, in a manner similar to strain relief connectors 112 of FIG. 3A. Here, each of strain relief connectors 122, while laterally extending in the positive X direction, can curve upward from connection bus 110 at point 122a towards the positive Y direction to initiate a U-shaped curve 122b that changes direction at axis of symmetry a-a towards the negative Y direction to straight portion 122c. Straight portion 122c can extend towards the negative Y direction to initiate U-shaped curve 122d that changes direction at a point of symmetry b-b and then extends towards the positive Y direction to straight portion 122e, which terminates at point 122f. While U-shaped curve 122b resembles less of a complete "U" than U-shaped curve 122d, as noted above, a U-shaped curve can be a symmetric curve or curve portion having a parabolic shape that includes an identifiable axis of symmetry, which here is axis a-a, and does not necessarily resemble a complete letter "U."

In some embodiments, the area encompassed by zone 122p can be used as a soldering pad, which truncates the effective non-linear geometry of strain relief connectors 122 between zone 122p and point 122a. Accordingly, the effective non-linear geometry of strain relief connectors 122 becomes asymmetric about axis c-c to have, for example, less total length and number of curved portions than the non-linear geometry of strain relief connectors 112 of FIG. 3A. This can result with strain relief connectors 122 being relatively stiffer than strain relief connectors 112 of FIG. 3A, for example, because the path between point 122a and zone 122p more resembles a straight line than the path between points 112a and 112f of FIG. 3A. This can be desirable for providing connectors where durability is required, for example, for PV modules used in high vibration environments, because connectors having stiffer non-linear geometry can be stronger in some situations.

The pattern and number of curves for each of strain relief connectors 122 can be variable. Fifteen of strain relief connectors 122 are shown here, with five of strain relief connectors 126 assigned per string. However, more or less strain relief connectors 126 can be used. This is demonstrated at FIG. 3D, which shows a top view of connection member 124, which can be used with PV module 100 of FIG. 2. Connection member 124 can include connection bus 110, as described with respect to FIG. 3A, and can include any of the aspects discussed with reference to the connection members disclosed herein.

The non-linear geometry of strain relief connectors 122 of FIG. 3A is shared here with strain relief connectors 126 of connection member 124 of FIG. 3B. Accordingly, each of strain relief connectors 126 is shaped in the same manner as each of strain relief connectors 122. However, each of strain relief connectors 126 can be configured to have less mass than each of strain relief connectors 122. For example, by using less material in any dimension, each of strain relief connectors 126 can have half the mass of each of strain relief connectors 122. Accordingly, one of strain relief connectors 126 is more flexible than one of strain relief connectors 122. Utilizing strain relief connectors that have more relative flexibility can be advantageous for PV modules that are expected to encounter wide variations in temperature (e.g, up to 200° C. temperature swings).

The pattern and number of curves for each of strain relief connectors 126 can be varied. Thirty nine of strain relief connector 126 are shown here, with thirteen of strain relief connector 126 assigned per string. However, more or less strain relief connectors 126 can be used to tune the desired resiliency of connection member 124.

Figures 3E, 3F:
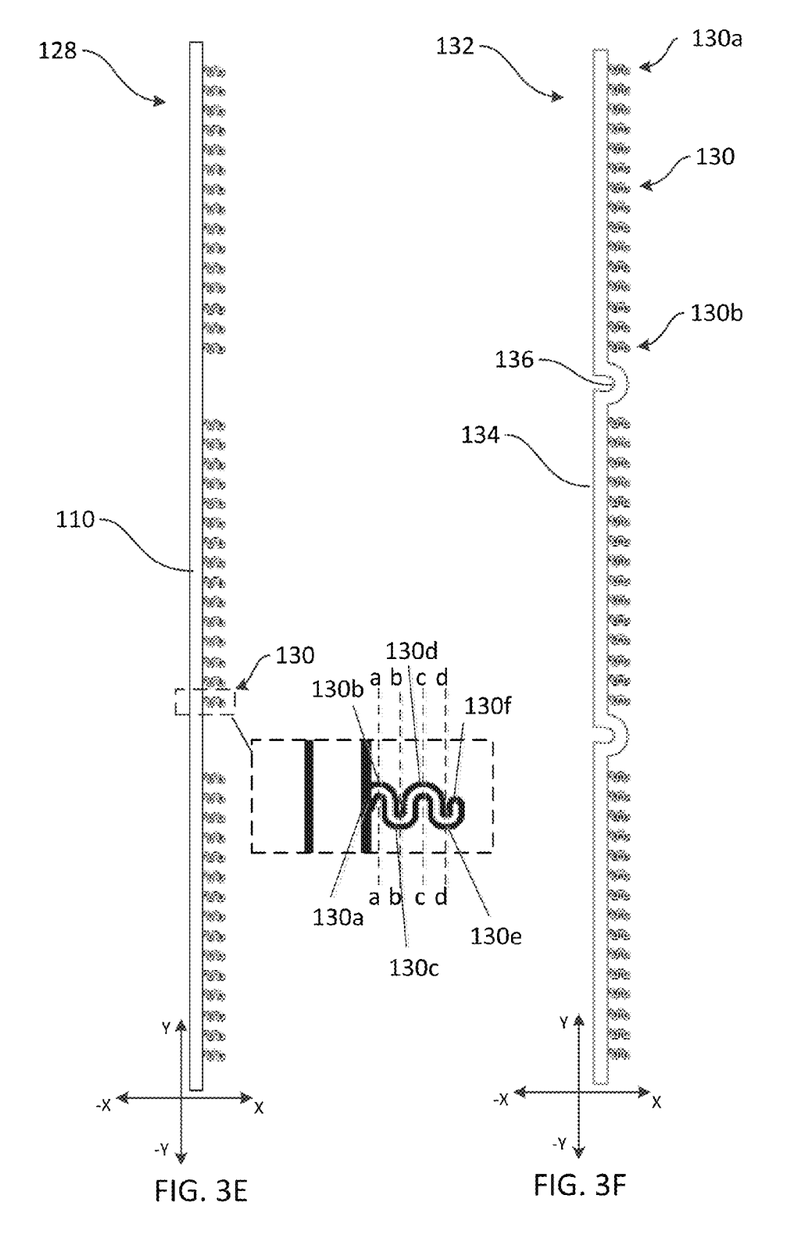

FIG. 3E shows a top view of connection member 128, which can be used with PV module 100 of FIG. 2 for example. Connection member 128 can include connection bus 110, as described with respect to FIG. 3A, and can include any of the aspects discussed with reference to the connection members disclosed herein.

Each of strain relief connectors 130 can extend laterally from connection bus 110 in a non-linear manner. The non-linear geometry of each of strain relief connectors 130 can resemble a sinusoidal wave pattern having two complete wave forms. Here, each of strain relief connectors 130 extends in the positive X direction from connection bus 134 at point 130a upwardly in the positive Y direction to form U-shaped curve 130b, which changes direction at axis of symmetry a-a to a straight portion that transitions to form U-shaped curve 130c. U-shaped curve 130c changes direction at axis of symmetry b-b to curve to a straight portion that transitions to form U-shaped curve 130d. U-shaped curve 130d changes direction at axis of symmetry c-c to curve to a straight portion that transitions to form U-shaped curve 130e. U-shaped curve 130e can change direction at axis of symmetry d-d to curve to a straight portion that terminates at point 130f. To compare, each of strain relief connectors 130 generally has more U-shaped curves 130b-e, than the single U-shaped curve 112b of each of strain relief connectors 110 of FIG. 3A for example.

Due to this increased number of curves, each of strain relief connectors 130 can be comparatively more flexible than each of strain relief connectors 112 of FIG. 3A. Assuming that all other factors remain equal, increasing the number of curves of a strain relief connector can increase flexibility, with resorting to mass reduction, which can reduce durability. Accordingly, if a strain relief connectors requires more flexibility, then adding one or more curves or curve portions can be helpful in this regard. It has been found that having four curves in the pattern depicted at FIG. 3E, provides a good balance of flexibility and durability.

The pattern and number of curves for each of strain relief connectors 130 can be varied. Forty-nine of strain relief connectors 130 are shown here, with fifteen of strain relief connectors 130 assigned per string. However, more or less strain relief connectors 130 can be used.

FIG. 3F shows a top view of connection member 132, which can be used with PV module 100 of FIG. 2 (for example) and can include any of the aspects discussed with reference to the connection members disclosed herein. Connection member 132 can include connection bus 134, which is elongated for connection to one or more strings. Here, connection member 132 is configured to connect three strings in parallel. Connection member 132 includes strain relief connectors 130 per connection member 128 of FIG. 3E, and arranged in a similar manner. Connection member 132 can differ from connection member 128 in that connection member 132 can include flexible bus members 136, which can be located between strings.

Flexible bus members 136 can help contribute strain relief between strings. In particular, lateral most strain relief connectors 130a/130b can experience more stress due to movement of the strings, which can compress or extend lateral most strain relief connectors 130a/130b more than strain relief connectors 130 there between. Flexible bus members 136 can help connection bus 134 preferentially flex during thermal expansion or contraction, which can help reduce stress at lateral most strain relief connectors 130a/130b by helping maintain uniformity of strain across all of strain relief connectors 130 attached to a shared string.

Figures 4A, 4B:
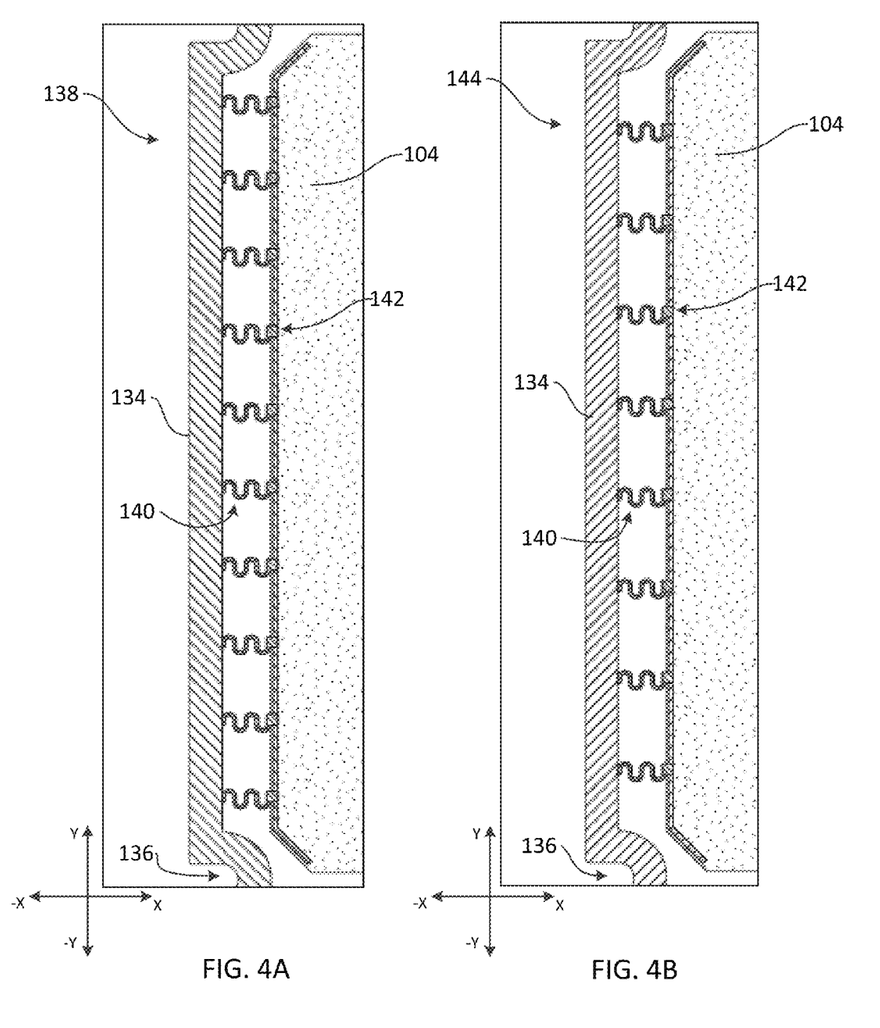
FIGS. 4A-4C show top views of connection members connected to strings, according to some embodiments of the invention.

FIG. 4A shows a top view of a portion of connection member 138, connected to string 104, which can be used with PV module 100 of FIG. 2 for example. Connection member 138 can include connection bus 134, as described with respect to FIG. 3G, and can include any of the aspects discussed with reference to the connection members disclosed herein.

Strain relief connectors 140 extend laterally from connection bus 134, with non-linear geometry similar to strain relief connectors 130 of FIG. 3E. However, in addition to what is described above with respect to strain relief connectors 130, each of strain relief connectors 140 can terminate at solder pad 142 to help form an electrical connection with string 104. Solder pad 142 can have a rectangular shape and hold a predetermined amount of solder material for reflow soldering to string 104.

The pattern and number of curves for each of strain relief connectors 140 can be varied. Ten of strain relief connectors 140 are shown connected string 104. However, more or less can be used. For example, FIG. 4B shows a top view of a portion of connection member 144, which shares almost the same construction as connection member 138 of FIG. 4A. However, here, connection member 144 includes eight of strain relief connectors 140, as compared to ten of strain relief connectors 140 for connection member 138.

In comparison to connection member 138 of FIG. 4A, which uses more strain relief connectors 140, connection member 144 of FIG. 4B can provide a more flexible connection between connection bus 134 and string 104. This can be useful for tuning flexibility for a given PV module, for example when environmental factors require more flexibility. In addition, the number of strain relief connectors assigned per string can be variable along a single connection bus, with more or less strain relief connectors being used for one string portion as compared to another string portion. This can be useful for tuning flexibility of a PV module where one string location is expected to exhibit more or less strain than another string location.

Figure 4C:
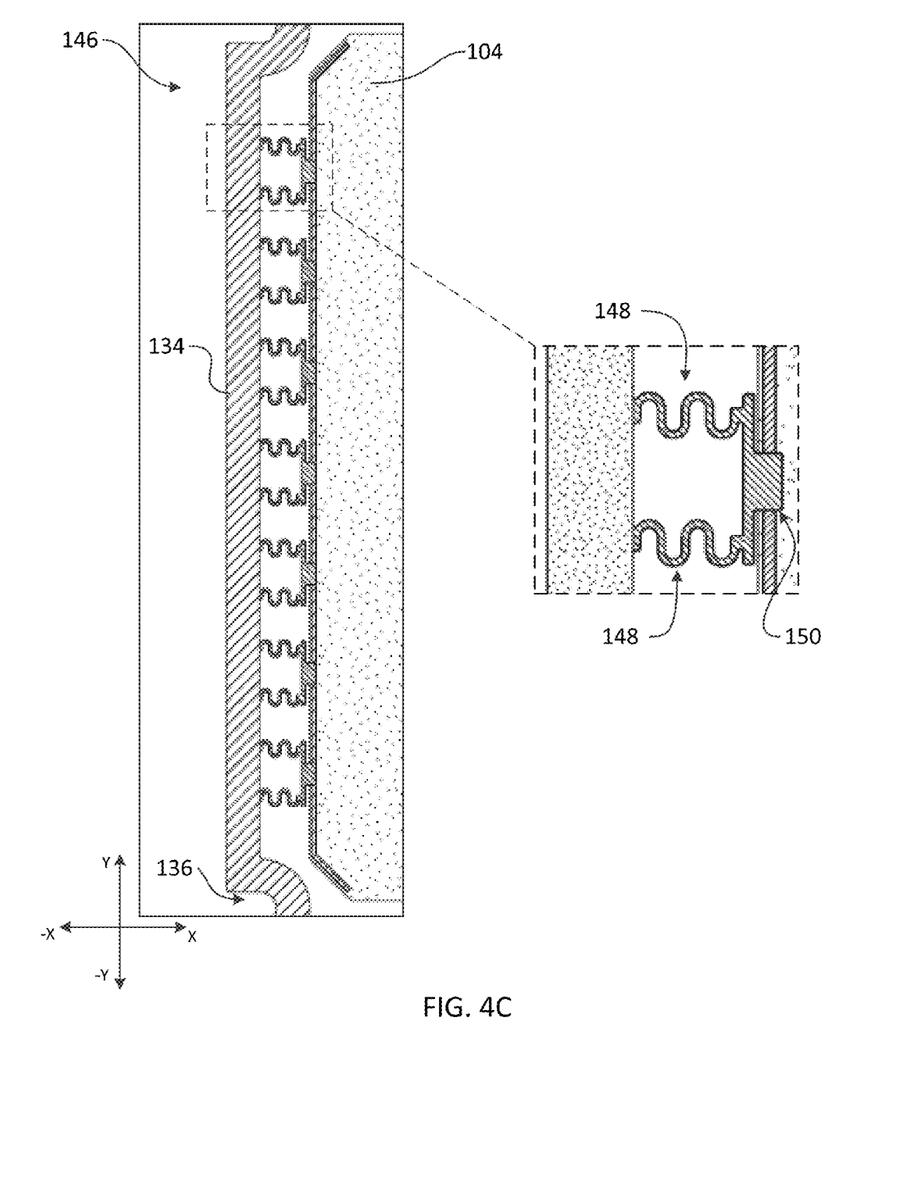

FIG. 4C shows a top view of a portion of connection member 146, connected to string 104, which can be used with PV module 100 of FIG. 2, for example. Connection member 146 can include connection bus 134, as described with respect to FIG. 3G, and can include any of the aspects discussed with reference to the connection members disclosed herein.

Strain relief connectors 148 can extend laterally from connection bus 134, with non-linear geometry similar to strain relief connectors 130 of FIG. 3E. However, in addition to what is described above with respect to strain relief connectors 130, pairs of strain relief connectors 148 can terminate at shared solder pads 150 to help form an electrical connection with string 104. Shared solder pad 150 can have a rectangular or other shape and hold a predetermined amount of solder material for reflow soldering to string 104. Pairing strain relief connectors 148 to shared soldering pads 150 as shown can aid in manufacturability, because only one soldering connection is required for every two of strain relief connectors 148. However, more than two of strain relief connectors 148 can be joined to share a soldering pad.

Figure 5A:
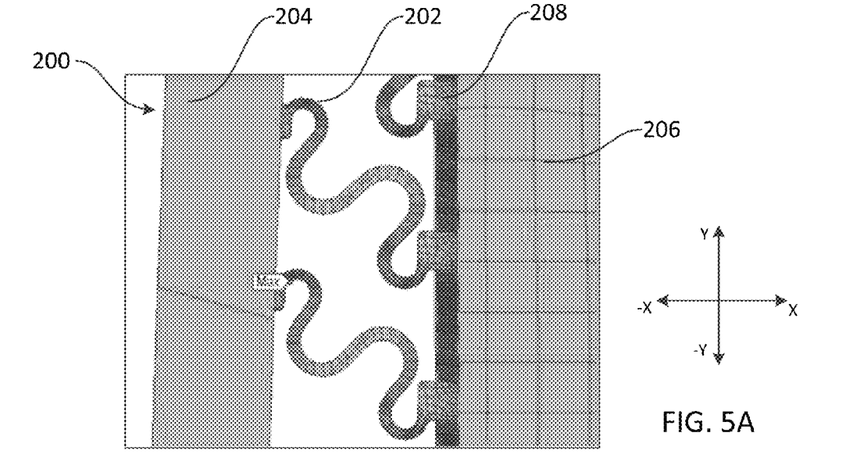
FIGS. 5A-5C show top views of connection members in simulated use, according to some embodiments of the invention.
Figure 5B:
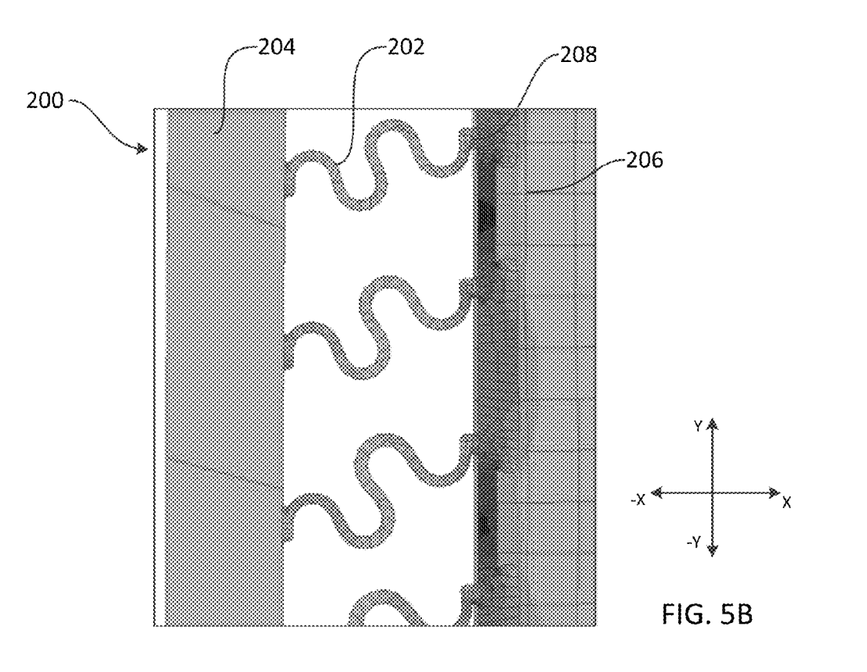
Figure 5C:
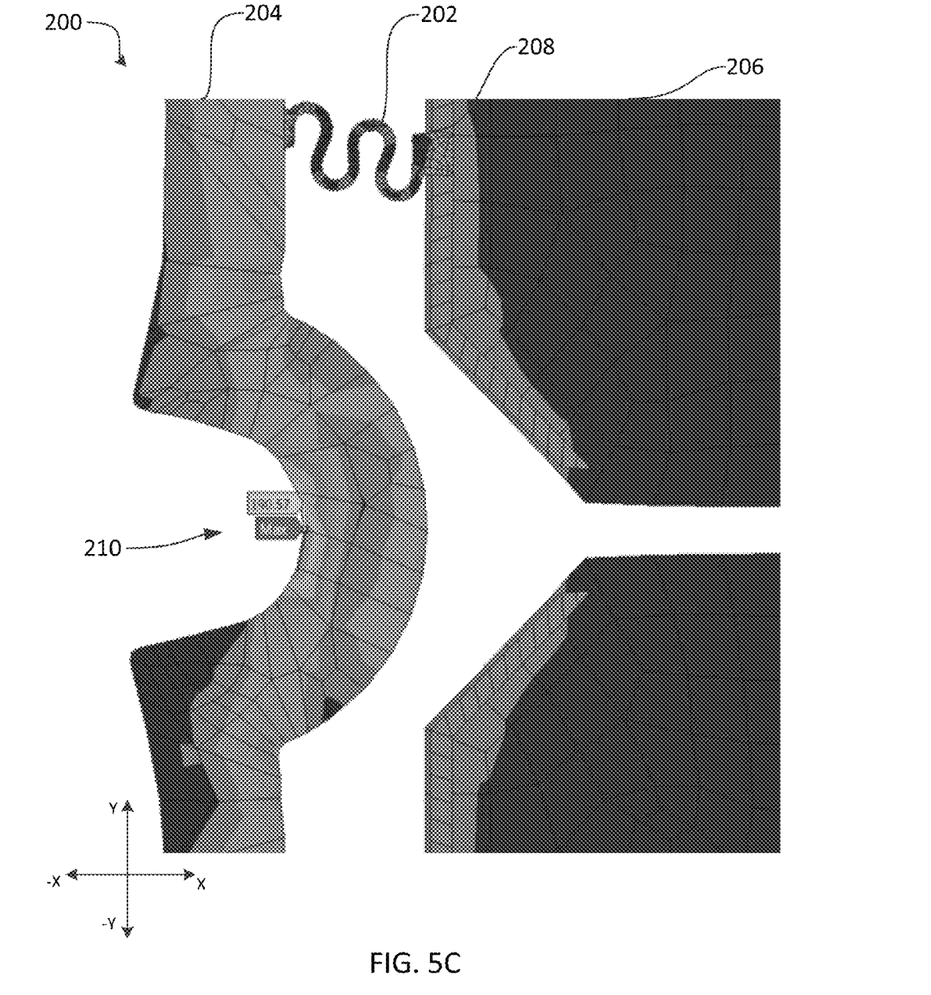

FIGS. 5A-5C shows a portion of connection members 200 in simulated use to determine Von Mises stress incurred by strain relief connectors during thermal cycling. Each of connection members 200 includes strain relief connectors 202 connected between connection bus 204 and string 206. Generally, it is desirable to incur Von Mises stresses that are less than the yield strength of the material used, such that the material does not plastically or ultimately yield during expected use.

A very flexible strain relief connector of little mass may be the most helpful when it comes to reducing strain at string bonds, but the more flexible the strain relief connector is, the more likely it is to break during use due to a lower Von Mises yield point. In contrast, a less flexible strain relief connector may be more durable, but that may be inconsequential if string breakage occurs due to transfer of movement originating from a connection bus. Hence, the design considerations of strength and flexibly must be balanced for a strain relief connector design. The use of finite element analysis (FEA) can be helpful in predicting which designs may be successful for a given set of environmental parameters.

At FIG. 5A, connection bus 204 is moved in the positive Y direction to cause shearing between connection bus 204 and string 206. This causes strain relief connectors 202 to extend in the positive Y direction from solder pads 208. The modeling performed is illustrative of forces experienced by thermally induced movement of connection bus 204 at 140° C. At FIG. 5B, connection bus 204 is moved in the negative Y direction to cause shearing between connection bus 204 and string 206, in the opposite direction shown at FIG. 5A. This causes strain relief connectors 202 to extend in the negative Y direction from solder pads 208. The modeling performed is also illustrative of forces experienced by thermally induced movement of connection bus 204 at 150° C.

In both of the examples of FIGS. 5A and 5B it was predicted that the strain relief connectors shown experience about 90 MPa of Von Mises stress, which is less than the yield strength for copper which is approximately 260 MPa. Accordingly, this simulated testing can help one skilled in the art configure (e.g., increasing or decreasing the number of curves per strain relief connectors 202, adjusting thickness in any direction of strain relief connectors 202, and adjusting the amount of strain relief connectors 202) the non-linear geometry of strain relief connectors 202 to have a certain Von Mises yield point, with a necessary factor of safety.

At FIG. 5C, the modeling performed is illustrative of forces experienced by thermally induced movement of connection bus 204, and particularly flexible bus member 210 at −40° C. The design shown experiences about 201 MPa of Von Mises stress at flexible bus member 210, which is less than the yield strength for copper which is approximately 260 MPa. Accordingly, this simulated testing can help one skilled in the art configure (e.g., increasing or decreasing the number of curves per flexible bus member 210, adjusting thickness in any direction of flexible bus member 210, and adjusting the amount of flexible bus members 210) the non-linear geometry of flexible bus member 210 to have certain Von Mises yield point, with a necessary factor of safety.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims.

What is claimed is:

1. A photovoltaic (PV) module comprising:
    a string comprising a plurality of electrically connected solar cells, wherein adjacent solar cells of the string overlap;
    an elongated connector connected to the string, the elongated connector comprising a plurality of strain relief connectors for connection to the string,
    wherein the plurality of strain relief connectors are shaped to preferentially deform to provide strain relief for the string
    wherein the string extends in a first direction,
    wherein the elongated connector is planar and comprises a connection bus portion extending along a first straight line in a second direction perpendicular to the first direction, and a plurality of soldering pads positioned along a second straight line extending in the second direction on the string,
    wherein the plurality of strain relief connectors comprises a plurality of pairs of strain relief connectors, wherein each pair comprises a first strain relief connector and a second strain relief connector both directly connected to and terminating at a single shared soldering pad of the plurality of soldering pads, and
    wherein each of the plurality of strain relief connectors extends from the connection bus portion in a direction parallel to the first direction and each of the plurality of strain relief connectors comprising a plurality of curved portions defining at least two complete sinusoidal waveforms between the connection bus portion and the shared soldering pad.

2. The PV module of claim 1, wherein each of the plurality of strain relief connectors are planer and do not change direction in a direction perpendicular to a plane defined by the first and second direction.

3. The PV module of claim 1, wherein the connection bus portion comprises a first connection bus portion configured to connect to the string and a second connection bus portion configured to connect to a further string, wherein a flexible bus portion non-linearly connects the first connection bus portion to the second connection bus portion.

* * * * *